(12) United States Patent
Tiwari et al.

(10) Patent No.: US 8,749,286 B2
(45) Date of Patent: Jun. 10, 2014

(54) PROGRAMMABLE SCANNABLE STORAGE CIRCUIT

(75) Inventors: Pranjal Tiwari, Bangalore (IN); Aishwarya Dubey, Bangalore (IN); Naishad Narendra Parikh, Bangalore (IN); Puneet Sabbarwal, Bangalore (IN); Anand Bhat, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/291,263

(22) Filed: Nov. 8, 2011

(65) Prior Publication Data

US 2013/0057329 A1    Mar. 7, 2013

(51) Int. Cl.
*H03K 3/00* (2006.01)
*H03K 3/012* (2006.01)

(52) U.S. Cl.
CPC ..................................... *H03K 3/012* (2013.01)
USPC ........................................................ 327/199

(58) Field of Classification Search
USPC ......... 327/199–203, 208, 210–212, 214, 215, 327/218
See application file for complete search history.

(56) References Cited

U.S. PATENT DOCUMENTS

| 7,492,201 | B2 * | 2/2009 | Aksamit | 327/202 |
| 2008/0218234 | A1 * | 9/2008 | Jain | 327/202 |

* cited by examiner

*Primary Examiner* — Sibin Chen
(74) *Attorney, Agent, or Firm* — Ronald O. Neerings; Wade James Brady; Frederick J. Telecky, Jr.

(57) ABSTRACT

A scannable storage circuit includes a scan enable input, a storage element having a Node coupled to a data output buffer for driving a data output terminal. The data output buffer includes an inverter; a transmission gate having a first MOS transistor and a second MOS transistor with sources and drains coupled to each other, drains coupled to an output of the inverter and sources coupled to the data output terminal and gates coupled to the scan enable input and an inverted scan enable input. A third MOS transistor and a fourth MOS transistor is coupled to the sources of the first and second MOS transistors, the third MOS transistor and fourth MOS transistor are configured to pull up or pull down the data output terminal in response to a first control signal and a second control signal respectively. A scan output is generated from the output of the inverter.

7 Claims, 6 Drawing Sheets

US 8,749,286 B2

PROGRAMMABLE SCANNABLE STORAGE CIRCUIT

TECHNICAL FIELD

Embodiments of the invention relate generally to scannable storage circuits.

BACKGROUND

In integrated circuit (IC) testing, the test technique of internal embedded scan design has become a cost effective solution to test the operation of ICs. Scan design is accomplished by altering the structure of standard flip-flops and latches (storage elements) within the IC into scan flip-flops and latches by providing a second alternate scan input for scan data parallel to the functional data input. The alternate input for scan data is generally implemented by placing a multiplexor in front of the standard input which selects either scan data or functional data. These "scannable" elements are then connected together in a serial shift register fashion by connecting the output of one element to the scan input of a next element via a "scan chain". The scan chain can load and unload internal IC state information by allowing scan data to be transferred from one element to another on each active clock edge when a scan enable signal is asserted.

The static timing analysis (STA) closure frequency in automatic test pattern generation (ATPG) shift mode of the scannable storage circuits are quite high, but production test description languages (TDLs) are run at lower frequencies due to high IR drop and reliability issues caused by the complete design logic toggling in the ATPG shift mode. Combinatorial logic contributes to more than 40% of power consumption in scan mode. It is not required for the logic to toggle during ATPG shift. If the toggle on functional combinational logic can be stopped, the ATPG shift frequency can be increased significantly resulting in lesser test-time and hence lesser tester cost. The power consumption of the design depends upon the choice of a "pull-down" Q gating or a "pull-up" Q gating flop for a particular path. Post silicon test programs' development makes it difficult to decide on a type of circuit that ensures minimum test power for all possible TDL combinations, especially in case of partial usage of "gated Q" flops.

In functional mode of operation, the SD (scan input) pins of flops are connected to SQ (scan data out) pins of the previous flop. Whenever there is a signal activity on the D (functional data) pin of a flop, the signal travels to the SD pins of the subsequent flops, thereby causing unnecessary power loss. Considerable amount of power is burnt unnecessarily on test circuits in functional operations. When device is operated in overdrive modes (high frequency modes), the power loss becomes significant causing faster battery discharge.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment discloses a scannable storage circuit that includes a scan enable input, and a storage element having a node coupled to a data output buffer for driving a data output terminal. The storage element is selectively coupled to a data input terminal and a scan input terminal in response to the scan enable input. The data output buffer includes an inverter; a transmission gate having a first metal oxide semiconductor (MOS) transistor and a second MOS transistor with sources and drains coupled to each other, drains coupled to an output of the inverter and sources coupled to the data output terminal and gates coupled to the scan enable input and an inverted scan enable input. A third MOS transistor and a fourth MOS transistor are coupled to the sources of the first and second MOS transistors, the third MOS transistor and fourth MOS transistor are configured to pull up or pull down the data output terminal in response to a first control signal and a second control signal respectively. A scan output is generated from the output of the inverter.

Another embodiment discloses a scannable storage circuit that includes a scan enable input, and a storage element having a node coupled to a data output buffer for driving a data output terminal. The data output buffer includes an inverter having a PMOS transistor and an NMOS transistor, an output of the inverter coupled to the data output terminal; a first MOS transistor with a drain coupled to a source of the NMOS transistor and with a source coupled to ground voltage and with a gate coupled to an inverted scan enable input, and a second MOS transistor having a source coupled to supply voltage, a drain coupled to the data output terminal and a gate coupled to the inverted scan enable input.

Yet another embodiment discloses a scannable storage circuit that includes a scan enable input, and a storage element having a node coupled to a data output buffer for driving a data output terminal. The data output buffer includes an inverter having a PMOS transistor and an NMOS transistor, an output of the inverter coupled to the data output terminal; a first MOS transistor with a source coupled to supply voltage, a drain coupled to a source of the PMOS transistor and with a gate coupled to an inverted scan enable input, a second MOS transistor having a drain coupled to the data output terminal, a source coupled to ground voltage and a gate coupled to the inverted scan enable input.

Still another embodiment discloses a scannable storage circuit that includes a scan enable input, and a storage element having a node coupled to a data output buffer for driving a data output terminal, the storage element selectively coupled to a data input terminal and a scan input in response to the scan enable input. The data output buffer includes an inverter coupled to the data output terminal; a transmission gate having a first MOS transistor with source and drain coupled to source and drain of a second MOS transistor, drains of the first and second MOS transistors being coupled to an input of the inverter and sources of the first and second MOS transistors being coupled to a scan output terminal, gates of the first MOS transistor and the second MOS transistor being coupled to the inverted scan enable input and a scan enable input respectively. A third MOS transistor is coupled to the sources of the first and second MOS transistors being coupled to a scan output terminal, configured to pull down the scan output terminal in response to an inverted scan enable input.

Yet still another embodiment discloses a scannable storage circuit that includes a scan enable input, a storage element having a node coupled to a scan output buffer for driving a scan output terminal. The scan output buffer includes an inverter having a PMOS transistor and an NMOS transistor, a first MOS transistor having a source coupled to the ground, a drain coupled to the source of the NMOS transistor and a gate coupled to the scan enable input. A second MOS transistor with a source is coupled to supply voltage and a drain is coupled to the scan output terminal a gate coupled to the scan enable input.

Still yet another embodiment discloses a scannable storage circuit that includes a scan enable input, a storage element having a node coupled to a scan output buffer for driving a scan output terminal, the storage element selectively coupled to a data input terminal and a scan input in response to the scan enable input, the scan output buffer comprising: an inverter having a PMOS transistor and an NMOS transistor, an output of the inverter coupled to the scan output terminal; a first MOS transistor having a source coupled to the supply voltage, a drain coupled to the source of the PMOS transistor and a gate coupled to an inverted scan enable input; and a second MOS transistor with a source coupled to ground, a drain coupled to the scan output terminal a gate coupled to the inverted scan enable input.

Other aspects and example embodiments are provided in the drawings and the detailed description that follows.

BRIEF DESCRIPTION OF THE VIEWS OF DRAWINGS

DETAILED DESCRIPTION OF THE EMBODIMENTS

Figure 1:
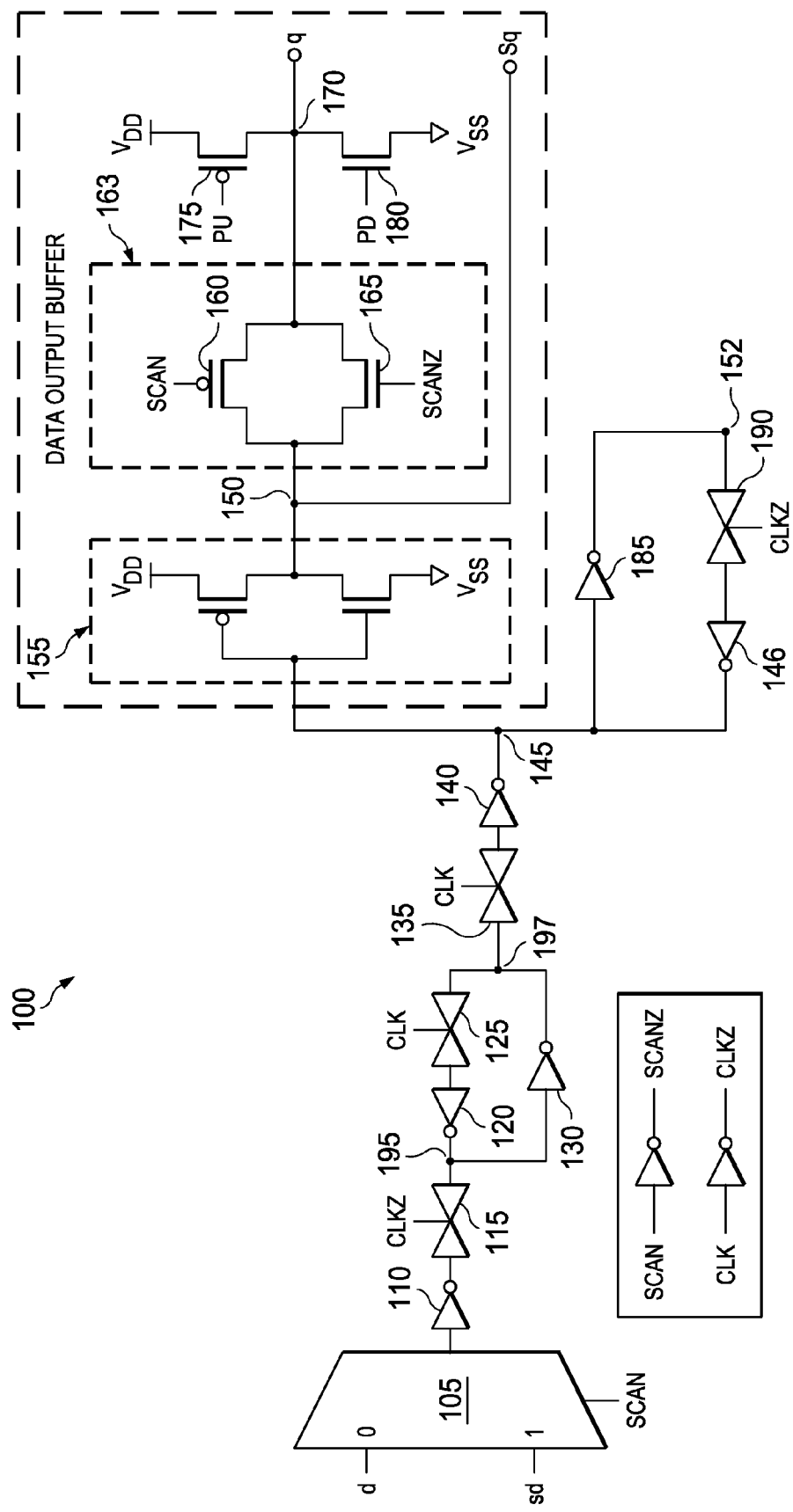
FIG. 1 illustrates a programmable scannable storage element according to an embodiment.

FIG. 1 illustrates a programmable scannable storage element 100 according to an embodiment. The programmable scannable storage element includes a node 145 coupled to a data output buffer for driving a data output terminal. The storage element is selectively coupled to a data input terminal and a scan input terminal in response to the scan enable input. The storage element includes a multiplexer 105 having a data input (d) and a scan input (Sd). A scan enable input (SCAN) is also provided to the multiplexer 105. An output of the multiplexer 105 is connected to an inverter 110 which is then connected to a transmission gate 115. In several embodiments. CLKZ is an inverted clock signal CLK. An inverted clock input CLKZ is given to the transmission gate 115. The transmission gate 115 is connected to a node 195. An inverter 130 is connected to node 195. Another transmission gate 125 is connected to an output of the inverter 130. Output of the transmission gate 125 is connected to the input of another inverter 120. The transmission gate 125 is connected to clock signal, CLK. An output of the inverter 130 is also connected to node 197. A transmission gate 135 is connected to node 197. An output of the transmission gate 135 is connected to an inverter 140 which is then connected to node 145. The data output buffer includes an inverter 155. An output of the inverter (having a PMOS transistor and an NMOS transistor as illustrated in 155) is connected to a node 150. A transmission gate 163 is connected to node 150. The transmission gate 163 includes a first MOS transistor (PMOS transistor 160) with source and drain coupled to source and drain of a second MOS transistor (NMOS transistor 165). Drains of the transistors 160 and 165 are connected to the output of the inverter (node 150). Sources of the transistors 160 and 165 are connected to the data output terminal (node 170). Gate of the transistor 160 is connected to scan enable input (SCAN) and gate of the transistor 165 is connected to an inverted scan enable input (SCANZ). The source of the PMOS transistor 175 is connected to the supply voltage and the drain is connected to the data output terminal (node 170). Gate of the transistor 175 is connected to pull up control signal (PU). The source of the NMOS transistor 180 is connected to the ground voltage and the drain is connected to the data output terminal (node 170). Gate of the transistor 180 is connected to pull down control signal (PD). Data output (q) of the scannable storage element is taken from node 170. Scan output (Sq) of the scannable storage element is taken from node 150. Node 145 is connected to inverter 185. The output of the inverter 185 is connected to node 152, which then connects to a transmission gate 190. The transmission gate 190 is controlled by inverted clock signal CLKZ. The transmission gate 190 drives another inverter 146. The output of the inverter 146 is again connected to node 145.

The operation of the programmable scannable storage element is now explained. The scan enable input (SCAN) to the multiplexer 105 selects the data input (d) or the scan input (sd) based on the value of the scan enable input. As illustrated in FIG. 1, if SCAN is logic 1 (or simply 1), scan input will be selected and if SCAN is logic 0 (or simply 0), data input will be selected. For explanation, consider SCAN as 1 (which means that the device is operating in the shift-mode). Assuming that sd is set to logic 1, output of the multiplexer 105 will be SCAN which is logic 1. The output of inverter 110 will be logic 0. When CLK is low the transmission gate 115 becomes transparent and the 0 at the input of transmission gets transferred to node 195, forcing the output of the inverter 130 (node 197) to be logic 1. When CLK becomes high the transmission gate 125 becomes transparent which transfers the values at node 197 (logic 1) to the inverter 120. The inverter 120 forces logic 0 on node 195.

Another transmission gate 135 in enabled when CLK becomes high and hence transfers the value at node 197 (logic 1) to the inverter 140. Inverter 140 forces logic 0 on node 145. Inverter 185, transmission gate 190 and inverter 146 comprise a loop back path when CLK is 0 and helps to retain the value at node 145. The inverter 155 inside data output buffer inverts the value at node 145 and produces a logic 1 at node 150. As scan is logic 1, the transistors 160 and 165 are disabled, hence the value at node 155 (logic 1), cannot be transferred to node 170, data output terminal q. The value at node 170 is controlled by the control signals PU and PD. Irrespective of the clock signal CLK, if PU and PD both are 0, node 170 will be pulled up to logic 1, and if PU and PD both are set to logic 1, then node 170 will be pulled down to logic 0. In shift mode the data output Q can be tied to either 0 or 1 (this will help in power reduction in shift mode due to combinational logic switching which is driven by data output terminal). For pulling up/pulling down the data output terminal, two additional control signals (first control signal and second control signal) PU (pull up control signal) and PD (pull down control signal) are provided. Using these control signals data output q is independently pulled up/pulled down depending upon which configuration results in low power consumption during shift mode. These control signals are driven by a power management module and they can be modified post silicon as well. To pull up the data output terminal Q, PU and PD both should be made 0. To pull down the data output terminal Q, PU and PD both should be made 1. The scan output terminal SQ will follow scan input SD at rising edge of the clock signal CLK and will retain its value otherwise. In functional mode (SCAN is 0), PU should be made 1 and PD should be made 0 (hence disabling any pull up/pull down feature in functional mode). In functional mode the data output terminal q (node 170) follows the data input terminal D (node 150) at rising edge of the clock signal CLK and retains its value otherwise. The scan output terminal SQ (node 150) follows the data input terminal D at rising edge of the clock signal CLK and retains its value otherwise. PU is connected to 0 and PD is connected to 1 is a forbidden condition (as it will create a direct path between power supply and ground and cause huge crowbar current resulting is huge power loss).

The embodiment of FIG. 1 further discloses a digital programmable mechanism that provides optimal control of the PU and PD signals for the module flops to allow optimal power consumption as well as minimal area overhead. A generic test RTL scheme is also provided to control the PU/PD signals of the flops as a module group in one embodiment. In several embodiments, a module group is defined as a configurable group of flops. The size of the group can range between 100 flops to as high as 10000 flops. A dedicated control register is defined in the test controller for each of module group. A representative "test sequence TDLs" is chosen and power is estimated on each of these module groups for minimized possible combinations of programmed values in the "control registers". By automatically analyzing the results of the power estimation, for every "class of TDL", the "best programming states" for minimum peak/average power consumption during ATPG scan shift is automatically determined.

The embodiment shown in FIG. 1 further provides flexibility to decide whether to pull up or down a particular flop's Q output post silicon and the power consumption seen on tester for any given TDL test sequence. One or all the flops for a digital module can be configured either in pull up Q gating or pull down Q gating mode (shift mode where the SD to Q path is disabled) for different TDL test sequences, thereby making this decision truly dynamic and configurable. A designer can decide, in the digital module, the detailed implementation granularity for the PU/PD control signals.

Figure 2:
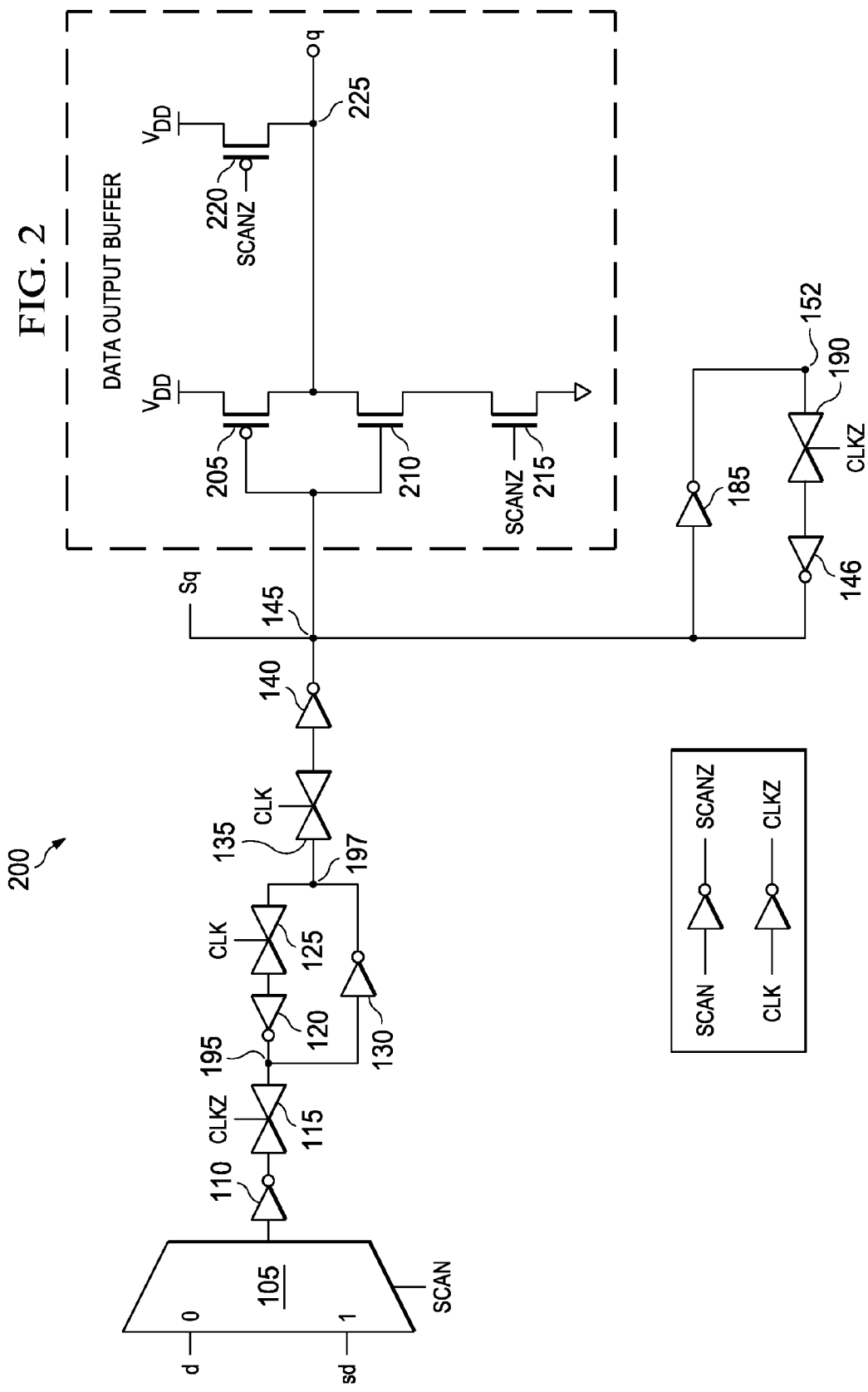
FIG. 2 illustrates a scannable storage element with data output pulled up in shift mode according to another embodiment.

FIG. 2 illustrates a programmable scannable storage element 200 with data output pulled up in shift mode according to another embodiment of the invention. The scannable storage element includes a node 145 coupled to a data output buffer for driving a data output terminal, the storage element is selectively coupled to a data input terminal and a scan input in response to the scan enable input. The storage element includes a multiplexer 105 having a data input and a scan input. A scan enable input (SCAN) is also given to the multiplexer 105. The output of the multiplexer 105 is connected to an inverter 110 which is then connected to a transmission gate 115. An inverted clock input CLKZ is given to the transmission gate 115. The transmission gate is connected a node 195. An inverter 130 is connected to node 195. Another transmission gate 125 is connected to an output of the inverter 130. Output of the transmission gate 125 is connected to the input of another inverter 120. The transmission gate 125 is connected to clock signal CLK. The output of the inverter 130 is also connected to node 197. A transmission gate 135 is connected to node 197. An output of the transmission gate 135 is connected to an inverter 140 which is then connected to node 145. The data output buffer includes a PMOS transistor 205 and an NMOS transistor 210. The source of the transistor 205 is connected to power supply voltage and the drain of the transistor 205 is connected to node 225.

The gate of transistor 205 is connected to node 145. The source of the transistor 210 is connected to the drain of another NMOS transistor 215 (first MOS transistor) and the drain of the transistor 210 is connected to node 225. The gate of transistor 210 is also connected to node 145. The source of the transistor 215 is connected to the ground voltage and the drain of the transistor 215 is connected to the source of the transistor 210. The gate of transistor 215 is connected to inverted scan enable input (SCANZ). Transistor 215 is used to disable VDD to VSS direct path when SCAN is 1. Another PMOS transistor 220 (second MOS transistor) is used to pull up the data output terminal q. The source of the transistor 220 is connected to the supply voltage and drain of the transistor 220 is connected to node 225 (data output terminal q). The gate of the transistor 220 is connected to inverted scan enable input (SCANZ). Data output (q) of the scannable storage element is taken from node 225. Scan output (Sq) of the scannable storage element is taken from node 145. Node 145 is connected to inverter 185. The output of the inverter 185 is connected to node 152, which then connects to a transmission gate 190. The transmission gate 190 is controlled by inverted clock signal CLKZ. The transmission gate 190 drives another inverter 146. The output of the inverter 146 is again connected to node 145.

The operation of the scannable storage element is now explained. The scan enable input to the multiplexer 105 selects the data input or the scan input based on the value of the scan enable input. As illustrated in the FIG. 2, if SCAN is 1, scan input will be selected and if SCAN is 0, data input will be selected. For explanation, consider SCAN as 1 (so the device is operating in the shift-mode). Assuming that sd is set to logic 1, output of the multiplexer 105 will be SCAN which is logic 1. The output of inverter 110 will be logic 0. When CLK is low the transmission gate 115 becomes transparent and the logic 0 at the input of transmission gets transferred to node 195, forcing the output of the inverter 130 (node 197) to be logic 1. When CLK becomes high the transmission gate 125 becomes transparent which transfers the values at node 197 (logic 1) to the inverter 120. The inverter 120 forces 0 on node 195. Another transmission gate 135 in enabled when CLK becomes high and hence transfers the value at node 197 (logic 1) to the inverter 140. Inverter 140 forces logic 0 on node 145. Inverter 185, transmission gate 190 and inverter 146 comprise a loop back path when CLK is 0 and helps to retain the value at node 145. Scan output terminal Sq is taken from node 145 and hence Sq will also become a logic 0 (inverted value of scan input sd). As SCAN is logic 1, the transistor 215 is disabled hence disabling the inverter comprised by transistors 205 and 210, whereas transistor 220 is enabled and pulls up the node 225 (the data output terminal q) in response to SCANZ. It is noted that transistor 215 is configured to protect leakage current through the inverter (formed by transistors 205 and 210) when the data output terminal is pulled up.

In shift mode the data output q is tied to 1 (this will help in power reduction in shift mode due to combinational logic switching which is driven by data output terminal). The scan enable input (SCAN) acts as a control signal, which decides whether to tie the data output terminal Q to logic 1 or not. When SCAN is 0, the data output terminal q follows the data input terminal D and the scan output terminal sq follows the inversion of data input terminal (d). When SCAN is 1, the data output terminal q is tied to logic 1 and the scan output terminal Sq follows the inversion of scan input (sd). According to this embodiment, average power over a number of ATPG shift cycles comes down as all the functional combinational logic does not toggle due to Q gating. Instantaneous peak power over the first shift cycle can be optimized by correctly choosing the type of flop for each logic block (pull-up or pull-down). This technique is extremely useful in case designers decide to convert only a subset of existing scan flops to this new design as then the peak/average power will depend upon the selection of "pull-up" or "pull-down" Q gating. The timing overhead is less than 10 pico seconds for the flop clock to Q delay. The performance impact is only during one kind of transition i.e. during q changing from 1→0 for pull up flop and Q changing from 0 to 1 for pull down flop where blocking transistor contributes an additional resistance. The circuit illustrated in FIG. 2 can be integrated within the flop without any area overhead as compared to the current flip flop circuit (with SQ output) available.

Figure 3:
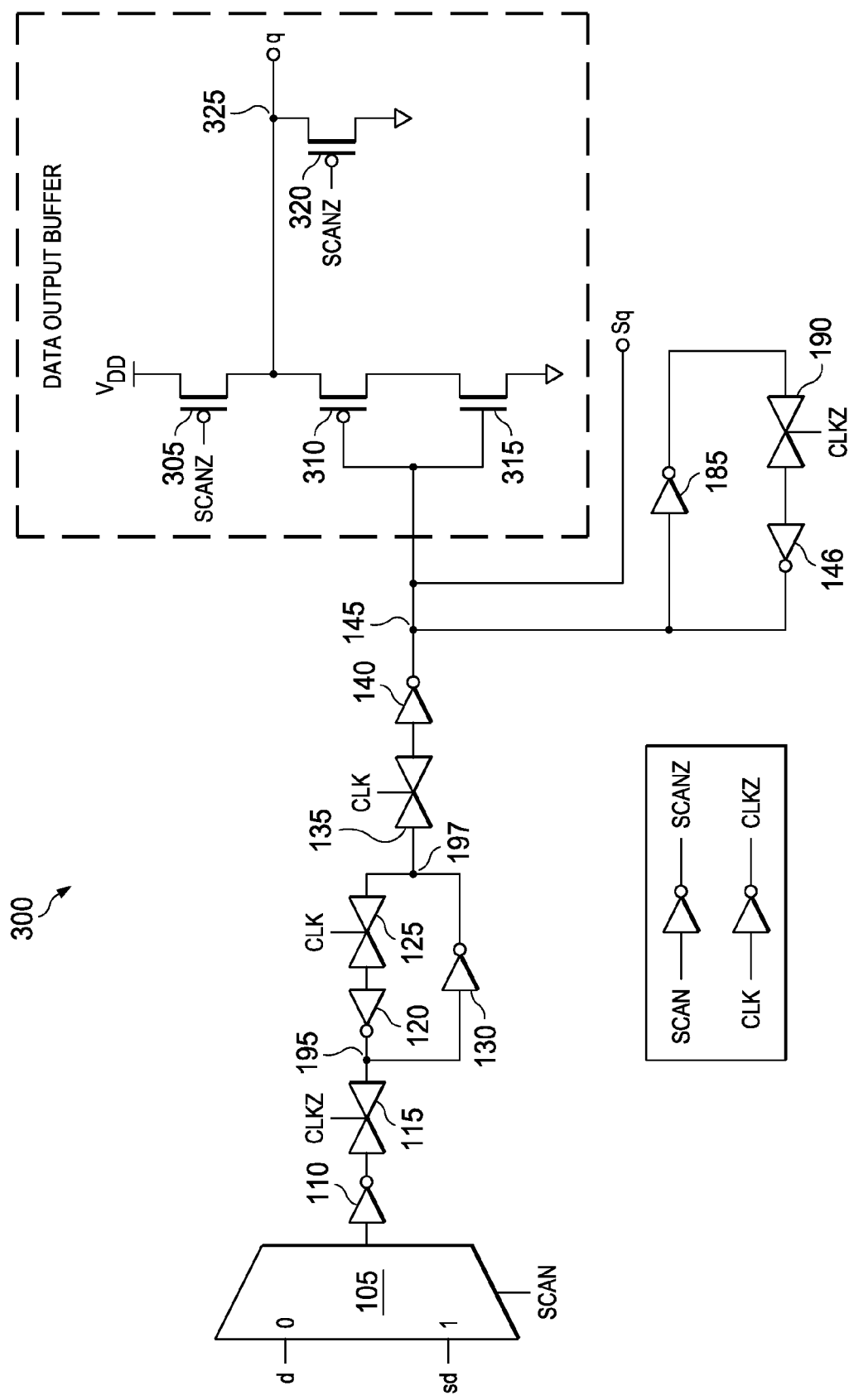
FIG. 3 illustrates a scannable storage element with data output pulled down in shift mode according to yet another embodiment.

FIG. 3 illustrates a programmable scannable storage element 300 with data output pulled down in shift mode according to yet another embodiment. The scannable storage element includes a node 145 coupled to a data output buffer for driving a data output terminal, the storage element is selectively coupled to a data input terminal and a scan input in response to the scan enable input. The storage element includes a multiplexer 105 having a data input and a scan input. A scan enable input (SCAN) is also given to the multiplexer 105. The output of the multiplexer 105 is connected to an inverter 110 which is then connected to a transmission gate 115. An inverted clock input CLKZ is given to the transmission gate 115. The transmission gate is connected a node 195. An inverter 130 is connected to node 195. Another transmission gate 125 is connected to an output of the inverter 130. Output of the transmission gate 125 is connected to the input of another inverter 120. The transmission gate 125 is connected to clock signal CLK. The output of the inverter 130 is also connected to node 197. A transmission gate 135 is connected to node 197. An output of the transmission gate 135 is connected to an inverter 140 which is then connected to node 145. The data output buffer includes a PMOS transistor 310 and an NMOS transistor 315. The source of the transistor 315 is connected to the ground voltage and the drain of the transistor 315 is connected to node 325. The gate of transistor 315 is connected to node 145. The source of the transistor 310 is connected to the drain of another PMOS transistor 305 and the drain of the transistor 310 is connected to node 325. The gate of transistor 310 is also connected to node 145. The source of the transistor 305 is connected to the supply voltage and the drain of the transistor 305 (first MOS transistor) is connected to the source of the transistor 310. The gate of transistor 305 is connected to scan enable input (SCAN). Transistor 305 is used to disable the direct path between VDD and VSS when SCAN is 1. Another NMOS transistor 320 is used to pull down the data output terminal q. The source of the transistor 320 (second MOS transistor) is connected to the ground voltage and drain of the transistor 320 is connected to node 325 (data output terminal q). The gate of the transistor 320 is connected to scan enable input (SCAN). Data output (q) of the scannable storage element is taken from node 325. Scan output (Sq) of the scannable storage element is taken from node 145. Node 145 is connected to inverter 185. The output of the inverter 185 is connected to node 152, which then connects to a transmission gate 190. The transmission gate 190 is controlled by inverted clock signal CLKZ. The transmission gate 190 drives another inverter 146. The output of the inverter 146 is again connected to node 145.

The operation of the scannable storage element is now explained. As illustrated in the FIG. 3, if SCAN is logic 1, scan input will be selected and if SCAN is logic 0, data input will be selected. For explanation, consider SCAN as logic 1 (so the device is operating in the shift-mode). Let's assume that sd is set to logic 1, which will be then available to multiplexer 105 output as SCAN is also logic 1. The output of inverter 110 will be logic 0. When CLK is low the transmission gate 115 becomes transparent and the logic 0 at the input of transmission gets transferred to node 195, forcing the output of the inverter 130 (node 197) to be 1. When CLK becomes high the transmission gate 125 becomes transparent which transfers the values at node 197 (logic 1) to the inverter 120. The inverter 120 forces 0 on node 195. Another transmission gate 135 in enabled when CLK becomes high and hence transfers the value at node 197 (Logic 1) to the inverter 140. Inverter 140 forces 0 on node 145. Inverter 185, transmission gate 190 and inverter 146 comprise a loop back path when CLK is 0 and helps to retain the value at node 145. Scan output terminal Sq is taken from node 145, so Sq will also become a 0 (inverted value of scan input sd). As SCAN is 1, the transistor 305 is disabled hence disabling the inverter comprised by transistors 310 and 315, whereas transistor 320 is enabled and pulls down the node 325 (the data output terminal q) in response to the SCANZ. Transistor 305 is configured to protect leakage current through the inverter when the data output terminal is pulled down. In shift mode the data output q is tied to 0 (this will help in power reduction in shift mode due to combinational logic switching which is driven by data output terminal). The scan enable input (SCAN) acts as a control signal, which decides whether to tie the data output terminal q to logic 0 or not. When SCAN is 0, the data output terminal q follows the data input terminal d and the scan output terminal Sq follows the inversion of data input terminal (d). When SCAN is 1, the data output terminal q is tied to logic 0 and the scan output terminal Sq follows the inversion of scan input (sd). According to this embodiment, average power over a number of ATPG shift cycles comes down as all the functional combinational logic does not toggle due to q gating. Instantaneous peak power over the first shift cycle can be optimized by correctly choosing the type of flop for each logic block (pull-up or pull-down). This technique is extremely useful in case designers decide to convert only a subset of existing scan flops to this new design as then the peak/average power will depend upon the selection of "pull-up" or "pull-down" Q gating. The timing overhead is less than 10 pico seconds for the flop clock to Q delay. The performance impact is only during one kind of transition i.e. during q changing from 1 to 0 for pull up flop and q changing from 0 to 1 for pull down flop where blocking transistor contributes an additional resistance. The circuit illustrated in FIG. 2 can be integrated within the flop without any area overhead as compared to the current flip flop circuit (with Sq output) available.

Figure 4:
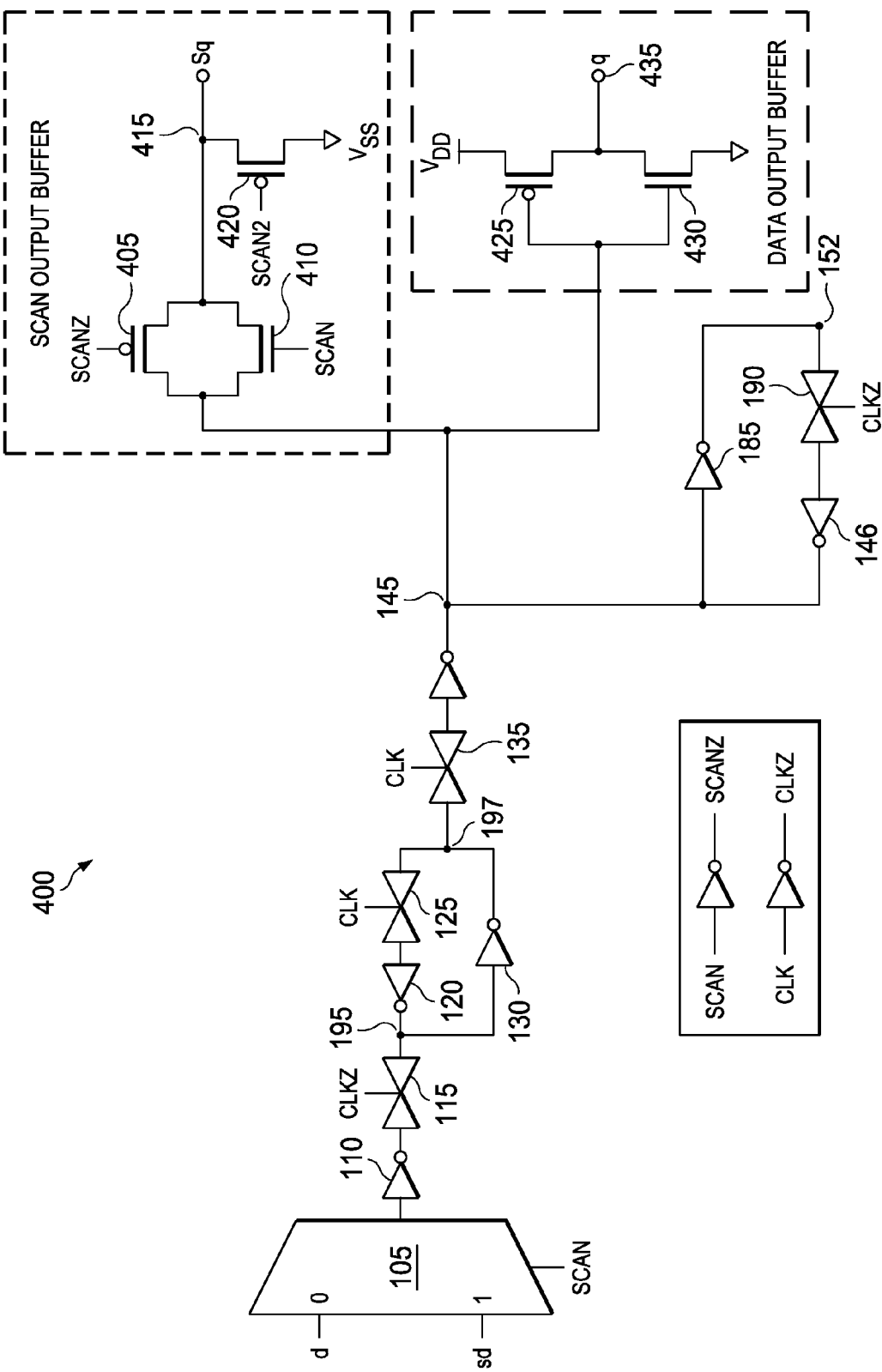
FIG. 4 illustrates a scannable storage element with scan output pulled down in functional mode according to still another embodiment.

FIG. 4 illustrates a programmable scannable storage element 400 with scan output pulled down in functional mode according to still another embodiment. The scannable storage element includes a node 145 coupled to a data output buffer for driving a data output terminal, the storage element is selectively coupled to a data input terminal and a scan input in response to the scan enable input. The storage element includes a multiplexer 105 having a data input and a scan input. A scan enable input (SCAN) is also given to the multiplexer 105. An output of the multiplexer 105 is connected to an inverter 110 which is then connected to a transmission gate 115. An inverted clock input CLKZ is given to the transmission gate 115. The transmission gate is connected a node 197. An inverter 130 is connected to node 195. Another transmission gate 125 is connected to an output of the inverter 130. Output of the transmission gate 125 is connected to the input of another inverter 120. The transmission gate 125 is connected to clock signal CLK. The output of the inverter 130 is also connected to node 197. A transmission gate 135 is connected to node 197. An output of the transmission gate 135 is connected to an inverter 140 which is then connected to node 145. The data output buffer includes a PMOS transistor 425 and an NMOS transistor 430 (comprising an inverter). The source of the transistor 425 is connected to the power supply voltage and the drain of the transistor 425 is connected to node 435. The source of the transistor 430 is connected to the ground voltage and the drain of the transistor 430 is connected to node 435. The gates of both the transistors (425 and 430) are connected to node 145. The data output terminal Q is connected to node 435. The scan output buffer includes a PMOS transistor 405 (first MOS transistor) and an NMOS transistor 410 (second MOS transistor) (forming a transmission gate) followed by a pull down NMOS transistor 420. Drains of the transistors 405 and 410 are connected to node 145. The sources of the transistors 405 and 410 are connected to node 415. The gate of the transistor 405 is connected to inverted scan enable input (SCANZ). The gate of the transistor 410 is connected to scan enable input (SCAN). The source of the transistor 420 (third MOS transistor) is connected to the ground voltage and the drain of the transistor 420 is connected to node 415. The gate of the transistor 420 is connected to inverted scan enable input (SCANZ). The scan output terminal SQ is connected to node 415. Node 145 is connected to inverter 185. The output of the inverter 185 is connected to node 152, which then connects to a transmission gate 190. The transmission gate 190 is controlled by inverted clock signal CLKZ. The transmission gate 190 drives another inverter 146. The output of the inverter 146 is again connected to node 145.

The operation of the scannable storage element is now explained. The scan enable input to the multiplexer 105 selects the data input or the scan input based on the value of the scan enable input. As illustrated in the FIG. 4, if SCAN is logic 1, scan input will be selected and if SCAN is logic 0, data input will be selected. For explanation, consider SCAN as logic 0 (so the device is operating in the functional-mode). Assuming that sd is set to logic 1, output of the multiplexer 105 will be SCAN which is logic 1. The output of inverter 110 will be logic 0. When CLK is low the transmission gate 115 becomes transparent and the logic 0 at the input of transmission gets transferred to node 195, forcing the output of the inverter 130 (node 197) to be logic 1. When CLK becomes high the transmission gate 125 becomes transparent which transfers the values at node 197 (logic 1) to the inverter 120. The inverter 120 forces logic 0 on node 195. Another transmission gate 135 in enabled when CLK becomes high and hence transfers the value at node 197 (logic 1) to the inverter 140. Inverter 140 forces logic 0 on node 145. Inverter 185, transmission gate 190 and inverter 146 comprise a loop back path when CLK is logic 0 and helps to retain the value at node 145. Transistors 425 and 430 (comprising an inverter) invert the value at node 145 and force a logic 1 at node 435. The data output terminal Q is taken from node 435. Transistors 405 and 410 comprising a transmission gate isolates node 415 from node 145 as SCAN is 0. Transistor 420 is enabled and pulls down the node 415 (scan output terminal SQ) irrespective of the clock signal CLK in functional mode (SCAN is logic 0). In functional mode the scan output Sq is tied to logic 0 (this will help in power reduction in functional mode due to combinational logic switching in scan path which is driven by scan output terminal). The scan enable input (SCAN) acts as a control signal, which decides whether to tie the scan output terminal Sq to logic 0 or not. The transmission gate isolates the scan output Sq from rest of the storage element when SCAN is logic 0. When SCAN is logic 0, the data output terminal q follows the data input terminal d and the scan output terminal Sq is tied to logic 0. When SCAN is logic 1, the data output terminal q follows the scan input terminal sd and the scan output terminal Sq follows the inversion of scan input (sd).

Figure 5:
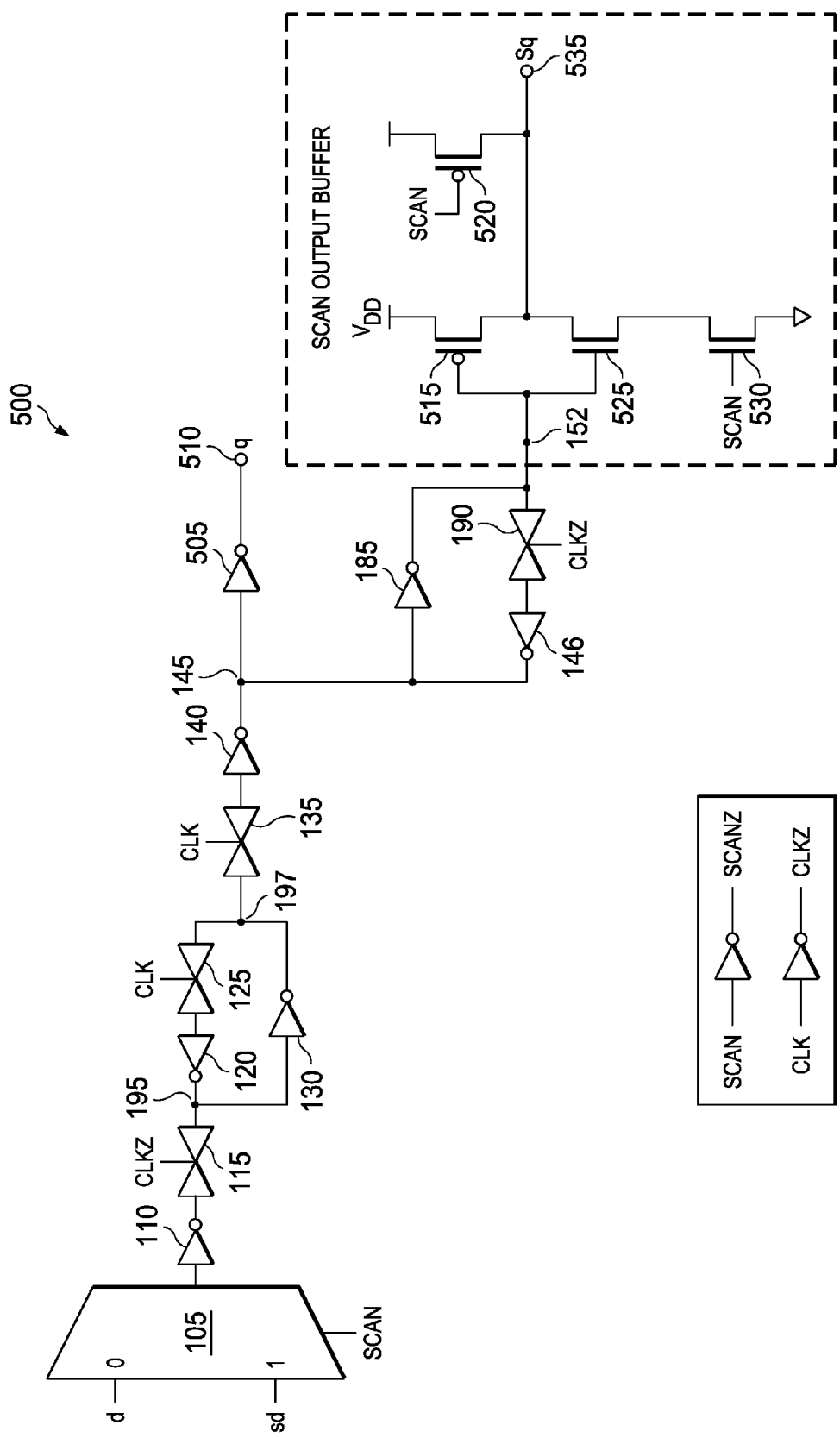
FIG. 5 illustrates a scannable storage element with scan output pulled up in functional mode according to yet still another embodiment.

FIG. 5 illustrates a scannable storage element with scan output pulled up in functional mode according to yet still another embodiment. The scannable storage element includes a node 145 coupled to a data output buffer for driving a data output terminal, the storage element is selectively coupled to a data input terminal and a scan input in response to the scan enable input. The storage element includes a multiplexer 105 having a data input and a scan input. A scan enable input (SCAN) is also given to the multiplexer 105. The output of the multiplexer 105 is connected to an inverter 110 which is then connected to a transmission gate 115. An inverted clock input CLKZ is given to the transmission gate 115. The transmission gate 115 is connected a node 195. An inverter 130 is also connected to node 195. Another transmission gate 125 is connected to an output of the inverter 130. Output of the transmission gate 125 is connected to the input of another inverter 120. The transmission gate 125 is connected to clock signal CLK. The output of the inverter 130 is also connected to node 197. A transmission gate 135 is connected to node 197. An output of the transmission gate 135 is connected to an inverter 140 which is then connected to node 145. The data output buffer includes an inverter 505. The input of the inverter 505 is connected to node 145 and the output of the inverter 505 is connected to node 510. The data output terminal q is connected to node 510. Node 145 is connected to inverter 185. The output of the inverter 185 is connected to node 152, which then connects to a transmission gate 190. The transmission gate 190 is controlled by inverted clock signal CLKZ. The transmission gate 190 drives another inverter 146. The output of the inverter 146 is again connected to node 145. The scan output buffer includes a PMOS transistor 515 and an NMOS transistor 525. The source of the transistor 515 is connected to power supply voltage and the drain of the transistor 515 is connected to node 535. The gate of the transistor 515 is connected to node 152. The source of the transistor 525 is connected to the drain of another NMOS transistor 530 (first MOS transistor) and the drain of the transistor 525 is connected to node 535. The gate of transistor 525 is also connected to node 152. The source of the transistor 530 is connected to the ground voltage and the drain of the transistor 530 is connected to the source of the transistor 525. The gate of transistor 530 is connected to scan enable input (SCAN). Transistor 530 is used to disable the direct path between VDD and VSS when SCAN is 0. Another PMOS transistor 520 (second MOS transistor) is used to pull up the scan output terminal Sq. The source of the transistor 520 is connected to the supply voltage and drain of the transistor 520 is connected to node 535 (scan output terminal Sq). The gate of the transistor 520 is connected to scan enable input (SCAN). Scan output (Sq) of the scannable storage element is taken from node 535.

The operation of the scannable storage element is now explained. The scan enable input to the multiplexer 105 selects the data input or the scan input based on the value of the scan enable input. As illustrated in the FIG. 5, if SCAN is logic 1, scan input will be selected and if SCAN is logic 0, data input will be selected. For explanation, consider SCAN as logic 0 (so the device is operating in the functional-mode). Assuming that d is set to logic 1, which will then be available to the multiplexer 105. The output of inverter 110 will be logic 0. When CLK is low the transmission gate 115 becomes transparent and the logic 0 at the input of transmission gets transferred to node 195, forcing the output of the inverter 130 (node 197) to be logic 1. When CLK becomes high the transmission gate 125 becomes transparent which transfers the values at node 197 (logic 1) to the inverter 120. The inverter 120 forces logic 0 on node 195. Another transmission gate 135 in enabled when CLK becomes high and hence transfers the value at node 197 (logic 1) to the inverter 140. Inverter 140 forces 0 on node 145. Inverter 185, transmission gate 190 and inverter 146 comprise a loop back path when CLK is logic 0 and helps to retain the value at node 145. As SCAN is logic 0, the transistor 530 is disabled, which stops the data propagation to node 535. At the same time transistor 520 is enabled which then pulls up the node 535 to logic 1. The scan output terminal SQ is connected to node 535. In functional mode the scan output SQ is tied to logic 1 (this will help in power reduction in functional mode due to combinational logic switching in scan path which is driven by scan output terminal). The scan enable input (SCAN) acts as a control signal, which decides whether to tie the scan output terminal Sq to logic 1 or not. When SCAN is logic 0, the data output terminal q follows the data input terminal d and the scan output terminal Sq is tied to logic 1. When SCAN is 1, the data output terminal q follows the scan input terminal sd and the scan output terminal Sq follows the inversion of scan input sd.

Figure 6:
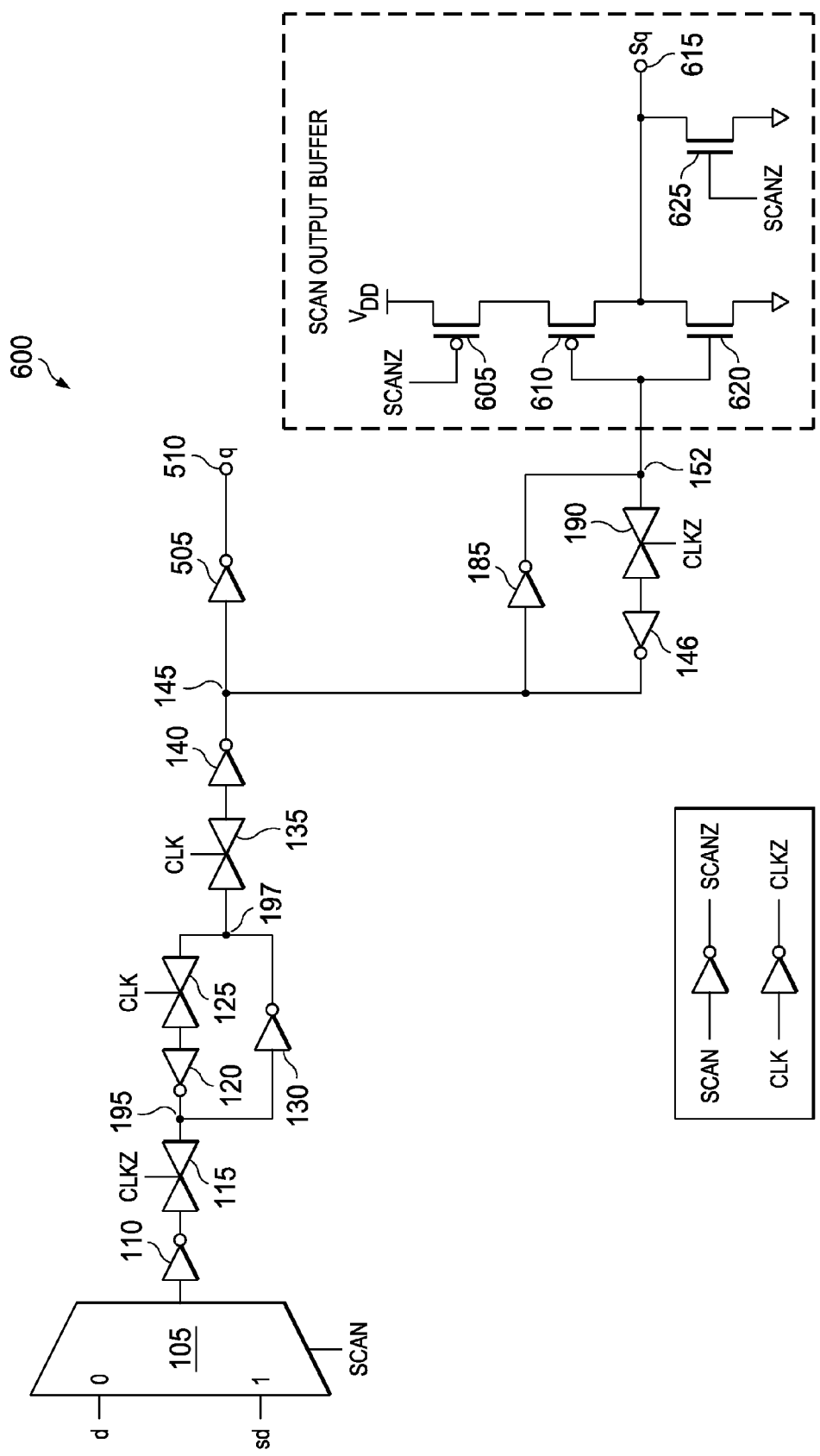
FIG. 6 illustrates a scannable storage element with scan output pulled up in functional mode according to still another embodiment.

FIG. 6 illustrates a scannable storage element 600 with scan output pulled up in functional mode according to still yet another embodiment of the invention. The scannable storage element includes a node 145 coupled to a data output buffer for driving a data output terminal, the storage element is selectively coupled to a data input terminal and a scan input in response to the scan enable input. The storage element includes a multiplexer 105 having a data input and a scan input. A scan enable input (SCAN) is also given to the multiplexer 105. An output of the multiplexer 105 is connected to an inverter 110 which is then connected to a transmission gate 115. An inverted clock input CLKZ is given to the transmission gate 115. The transmission gate is connected a node 195. An inverter 130 is connected to node 195. Another transmission gate 125 is connected to an output of the inverter 130. Output of the transmission gate 125 is connected to the input of another inverter 120. The transmission gate 125 is connected to clock signal CLK. The output of the inverter 130 is also connected to node 197. A transmission gate 135 is connected to node 197. An output of the transmission gate 135 is connected to an inverter 140 which is then connected to node 145. The data output buffer includes an inverter 505. The input of the inverter 505 is connected to node 145 and the output of the inverter 505 is connected to node 510. The data output terminal q is connected to node 510. Node 145 is connected to inverter 185. The output of the inverter 185 is connected to node 152, which then connects to a transmission gate 190. The transmission gate 190 is controlled by inverted clock signal CLKZ. The transmission gate 190 drives another inverter 146. The output of the inverter 146 is again connected to node 145. The data output buffer also includes a PMOS transistor 610 and an NMOS transistor 620. The source of the transistor 610 is connected to the drain of another PMOS transistor 605 (first MOS transistor) and the drain of the transistor 610 is connected to node 615. The gate of the transistor 610 is connected to node 152. The source of the transistor 620 is connected to the ground voltage and the drain of the transistor 620 is connected to node 615. The gate of transistor 620 is also connected to node 152. The source of the transistor 605 is connected to the power supply voltage and the drain of the transistor 605 is connected to the source of the transistor 610. The gate of transistor 605 is connected to inverted scan enable input (SCANZ). Transistor 605 is used to disable the direct path between VDD and VSS when SCAN is 0. Another NMOS transistor 625 (second MOS transistor) is used to pull down the scan output terminal SQ. The source of the transistor 625 is connected to the ground voltage and drain of the transistor 625 is connected to node 615 (scan output terminal SQ). The gate of the transistor 625 is connected to inverted scan enable input (SCANZ). Scan output (sq) of the scannable storage element is taken from node 615.

The operation of the scannable storage element is now explained. The scan enable input to the multiplexer 105 selects the data input or the scan input based on the value of the scan enable input. As illustrated in the FIG. 6, if SCAN is 1, scan input will be selected and if SCAN is 0, data input will be selected. For explanation, consider SCAN as logic 0 (so the device is operating in the functional-mode). Assuming that D is set to logic 1, which will be available to multiplexer 105 output as SCAN is set to logic 0. The output of inverter 110 will be logic 0. When CLK is low the transmission gate 115 becomes transparent and the logic 0 at the input of transmission gets transferred to node 195, forcing the output of the inverter 130 (node 197) to be logic 1. When CLK becomes high the transmission gate 125 becomes transparent which transfers the values at node 197 (logic 1) to the inverter 120. The inverter 120 forces logic 0 on node 195. Another transmission gate 135 in enabled when CLK becomes high and hence transfers the value at node 197 (logic 1) to the inverter 140. Inverter 140 forces logic 0 on node 145. Inverter 185, transmission gate 190 and inverter 146 comprise a loop back path when CLK is logic 0 and helps to retain the value at node 145. As SCAN is logic 0, the transistor 605 is disabled, which stops the data propagation to node 615. At the same time transistor 625 is enabled which then pulls down the node 615 to logic 0. The scan output terminal SQ is connected to node 615. In functional mode the scan output Sq is tied to logic 0 (this will help in power reduction in functional mode due to combinational logic switching in scan path which is driven by scan output terminal). The scan enable input (SCAN) acts as a control signal, which decides whether to tie the scan output terminal Sq to logic 0 or not. When SCAN is logic 0, the data output terminal q follows the data input terminal d and the scan output terminal Sq is tied to logic 0. When SCAN is logic 1, the data output terminal q follows the scan input terminal sd and the scan output terminal Sq follows the inversion of scan input (SD). Using the circuit as illustrated in FIGS. 4, 5 and 6, unnecessary toggling of scan data in functional mode can be avoided thereby reducing functional power by many milli watts for critical use cases where more than 1000 flops toggle simultaneously at greater than 100 Mhz range.

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A scannable storage circuit comprising:
a scan enable input;
a storage element having a node coupled to a data output buffer for driving a data output terminal, the storage element selectively coupled to a data input terminal and a scan input in response to the scan enable input, the data output buffer comprising:
an inverter;
transmission gate having a first MOS transistor with source and drain coupled to source and drain of a second MOS transistor, drains of the first and second MOS transistors being coupled to an output of the inverter and sources of the first and second MOS transistors being coupled to the data output terminal, gates of the first MOS transistor and the second MOS transistor being coupled to the scan enable input and an inverted scan enable input; and
a third MOS transistor and a fourth MOS transistor coupled to the sources of the first and second MOS transistors, the third MOS transistor configured to pull up the data output terminal in response to a first control signal and the fourth MOS transistor configured to pull down the data output terminal in response to a second control signal, wherein a scan output is generated from the output of the inverter;
a multiplexer that receives the scan enable input, data input and scan input, wherein the storage element is selectively coupled to the data input terminal and the scan input in response to the scan enable input; and
wherein the storage element further comprising a master latch coupled to a slave latch wherein an input of the master latch is coupled to an output of the multiplexer and an output of the slave latch is coupled to the data output buffer.

2. The storage circuit of claim 1, wherein a source of the third MOS transistor is coupled to supply voltage and a source of the fourth MOS transistor is coupled to ground voltage.

3. The storage circuit of claim 1, wherein the transmission gate is configured to tri-state the scan input in a scan mode of the storage circuit.

4. The storage circuit of claim 1 further comprising a multiplexer that receives the scan enable input, data input and scan input, wherein the storage element is selectively coupled to the data input terminal and the scan input in response to the scan enable input.

5. A method, comprising:
providing a scan enable input;
providing a storage element having a node coupled to a data output buffer for driving a data output terminal, the storage element selectively coupled to a data input terminal and a scan input in response to the scan enable input, the data output buffer comprising:
an inverter;
a transmission gate having a first MOS transistor with source and drain coupled to source and drain of a second MOS transistor, drains of the first and second MOS transistors being coupled to an output of the inverter and sources of the first and second MOS transistors being coupled to the data output terminal, gates of the first MOS transistor and the second MOS transistor being coupled to the scan enable input and an inverted scan enable input; and
a third MOS transistor and a fourth MOS transistor coupled to the sources of the first and second MOS transistors, the third MOS transistor configured to pull up the data output terminal in response to a first control signal and the fourth MOS transistor configured to pull down the data output terminal in response to a second control signal, wherein a scan output is generated from the output of the inverter; and
providing a multiplexer that receives the scan enable input, data input and scan input, wherein the storage element is selectively coupled to the data input terminal and the scan input in response to the scan enable input, the storage element further comprising a master latch coupled to a slave latch wherein an input of the master latch is coupled to an output of the multiplexer and an output of the slave latch is coupled to the data output buffer.

6. The method of claim 5, wherein a source of the third MOS transistor is coupled to supply voltage and a source of the fourth MOS transistor is coupled to ground voltage.

7. The method of claim 5, wherein the transmission gate is configured to tri-state the scan input in a scan mode of the storage circuit.

* * * * *